United States Patent
Ribeiro do Nascimento et al.

(10) Patent No.: US 8,063,624 B2
(45) Date of Patent: Nov. 22, 2011

(54) HIGH SIDE HIGH VOLTAGE SWITCH WITH OVER CURRENT AND OVER VOLTAGE PROTECTION

(75) Inventors: Ivan Carlos Ribeiro do Nascimento, Sao Paulo (BR); Walter Luis Tercariol, Sao Paulo (BR)

(73) Assignee: Freescale Semiconductor, Inc., Austin, TX (US)

( * ) Notice: Subject to any disclaimer, the term of this patent is extended or adjusted under 35 U.S.C. 154(b) by 428 days.

(21) Appl. No.: 12/402,907

(22) Filed: Mar. 12, 2009

(65) Prior Publication Data

US 2010/0231193 A1    Sep. 16, 2010

(51) Int. Cl.
    G05F 1/10    (2006.01)
    G05F 3/16    (2006.01)
(52) U.S. Cl. ..................... 323/315; 327/538
(58) Field of Classification Search .......... 323/315, 323/316, 317; 327/538, 541, 543
See application file for complete search history.

(56) References Cited

U.S. PATENT DOCUMENTS

| | | | | |
|---|---|---|---|---|
| 5,252,910 A | * | 10/1993 | Agaesse | 323/315 |
| RE34,772 E | * | 11/1994 | Bernard et al. | 323/313 |
| 5,835,994 A | * | 11/1998 | Adams | 323/315 |
| 5,959,464 A | | 9/1999 | Qualich | |
| 7,230,474 B2 | | 6/2007 | Yamamoto et al. | |
| 2008/0123238 A1 | | 5/2008 | Campos et al. | |

OTHER PUBLICATIONS

Industrial Control Design Line, A Primer on High-Side FET Load Switches, http://www.industrialcontroldesignonline.com/howto/199204060 May 3, 2007, printed Mar. 10, 2009.
M. Berkhout, Integrated Overcurrent Protection for Class D Power Stages, ESSCIRC '02, Proceedings of the 29th European Solid-State Circuits Conference, Sep. 16-18, 2003.
M. Berkhout, Integrated Overcurrent Protection System for Class-D Audio Power Amplifiers, IEEE Journal of Solid-State Circuits, vol. 40, No. 11, Nov. 2005.

* cited by examiner

*Primary Examiner* — Shawn Riley
(74) *Attorney, Agent, or Firm* — Hamilton & Terrile, LLP; Michael Rocco Cannatti

(57) ABSTRACT

A method and apparatus are described for providing a current mirror type high voltage switching circuit (60) having a reference branch (M2, M3, R1) and a tracking branch (M1, M5), where the output peak current is limited by adding an additional branch (M4, M6) to the current mirror circuit which includes an additional mirror transistor (M4) and cascode transistor (M6), and where over voltage protection is provided by including a shut-off circuit (Q1, Q2) which turns "OFF" the cascode transistors (M5-M8) whenever the output voltage (Vout) exceeds the first reference voltage (Vbat) by a predetermined amount.

20 Claims, 3 Drawing Sheets

(a) (b) (c)

HIGH SIDE HIGH VOLTAGE SWITCH WITH OVER CURRENT AND OVER VOLTAGE PROTECTION

BACKGROUND OF THE INVENTION

1. Field of the Invention

The present invention is directed in general to the field of electric circuits. In one aspect, the present invention relates to a high voltage switch circuit.

2. Description of the Related Art

In electronic control systems which include drive load devices, transistor-based load drivers or switches are used to drive the load devices. Ideally, the transistor-based switch generates a predetermined high level output voltage with a minimal voltage drop, while minimizing the output current while generating a predetermined low level output voltage. However, such switches typically include additional current sensing circuits for purposes of measuring the actual load current, protecting the transistor driver, optimizing load control, and/or performing diagnostics. However, such additional current sensing circuits can impair the performance of the transistor switch (e.g., by introducing lossy elements), can add to the manufacturing cost and complexity, and can introduce errors in the switch performance.

To illustrate the design and operation of conventional current limited switches, reference is now made to FIG. 1(a) which depicts an exemplary transistor-based switch circuit 1 that includes a simple transistor switch 4 (M1) is connected in series between a first reference voltage (e.g., battery voltage Vbat) and an output (Vout), and that is gated across a resistive load 2 (R1). While the transistor-based switch circuit 1 has a very low voltage drop across the first transistor 4 (M1), it will be appreciated by those skilled in the art that there are significant variations in the on-resistance (Rds-on) and output current (Io) which depend on the Vbat voltage, the manufacturing process variations, and temperature variations. These variations over the operating range of the switch circuit 1 can be problematic in certain applications, as illustrated in FIG. 2 which depicts, at line 11, a simulated plot of the output current (Io) from the switch circuit 1 which increases as the output voltage (Vout) decreases and the battery (Vbat) shows, the output current (Io) from the switch circuit 1 is quite high when the output voltage (Vout) is low, leading to current consumption and uncontrolled current (unpredictable amount of current) that is undesirable with low power applications.

To compensate for these variations, additional circuitry is typically included to provide optimal drive capability while offering protection against voltage or current fluctuations. For example, FIG. 1(b) depicts a current mirror circuit 3 that includes a tracking or tracing branch (including a first transistor 4 (M1) that is connected between the first reference voltage (Vbat) and the output load (Vout)). The current mirror circuit 3 also includes a reference branch, including a second transistor 6 (M2) and resistive load 2 (R1) supplying a current $I_{R1}$, that is connected between first and second reference voltages (e.g., battery voltage Vbat and ground). The gates of the first and second transistors M1 and M2 are connected to each other and to the resistive load 2 so that the output current (Io) which crosses the output load (Vout) tracks the current $I_{R1}$ from the resistive load 2. While the current mirror circuit 3 generates a limited output current as the output voltage (Vout) is lowered, the voltage drop is higher than the transistor-based switch circuit 1, resulting in a lower output current and a higher equivalent output resistance for this operation region. This is illustrated in FIG. 2 which depicts, at line 13, a simulated plot of the output current (Io) from the current mirror circuit 3. As shown by comparing the output current plots 11, 13 in the area where the voltage drop is close to zero (e.g., Vo=9-10 V), the output current is smaller, meaning that the current mirror circuit 3 has a higher series on-resistance value (Rds-on).

This reduction in the output current can be partially corrected to form a high side switch with auto limited current by adding an activation transistor to the reference branch. This is illustrated with the modified current mirror circuit 5 shown in FIG. 1(c) where the reference branch includes a current mirror activation transistor 8 (M3) connected in series between the second transistor 6 (M2) and resistive load 2 (R1) and gated by the output voltage (Vout). The operation of the modified current mirror circuit 5 is controlled by the drain-to-source voltage drop (Vds) over the first transistor 4 (M1) to provide the controlled current performance of the simple current mirror circuit 3 in the smaller output voltage regions, and to also provide the lower series on-resistance value (Rds-on) performance of the transistor-based switch circuit 1 in the higher output voltage regions (low output voltage drop region). In particular, when the Vds of the first transistor 1 (M1) is higher than the threshold voltage of the current mirror activation transistor 8 (M3), the current mirror activation transistor 8 (M3) is active or conductive, resulting in current $I_{R1}$ through the R1 resistor which turns the first and second transistors M1/M2 ON to work as a current mirror. However, when the Vds of the first transistor 4 (M1) is lower than M3 threshold voltage, the current mirror activation transistor 8 (M3) is not conductive (e.g., turned OFF) so that there is no current through the R1 resistor, and as a result, the gate-to-source voltage (Vgs) of the first transistor 4 (M1) is set to the first reference voltage (e.g., Vbat), in which case the modified current mirror circuit 5 works as a simple transistor switch. These two performance regions (current mirror and switch) for the modified current mirror circuit 5 are depicted in FIG. 2 which depicts, at line 15, a simulated plot of the output current (Io) from the modified current mirror circuit 5. As shown, the simulated plot line 15 includes a transition region 16. Below the transition region 16 (e.g., where the output voltage is less than approximately 5.2 V), the modified current mirror circuit 5 works as a current mirror, while above the transition region 16 (e.g., where the output voltage is greater than approximately 8.8 V), the modified current mirror circuit 5 works as a simple switch. However, in the transition region 16, there is a maximum or peak output current in the current plot 15 for the modified current mirror circuit 5 that is higher than the output current 13 for the simple current mirror circuit 3. This peak output current creates a performance problem in applications where the modified current mirror circuit 5 is used in an application that has a low power mode.

Accordingly, a need exists for an improved transistor-based switch with limited current, minimal voltage drop, and/or reduced output current peak to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
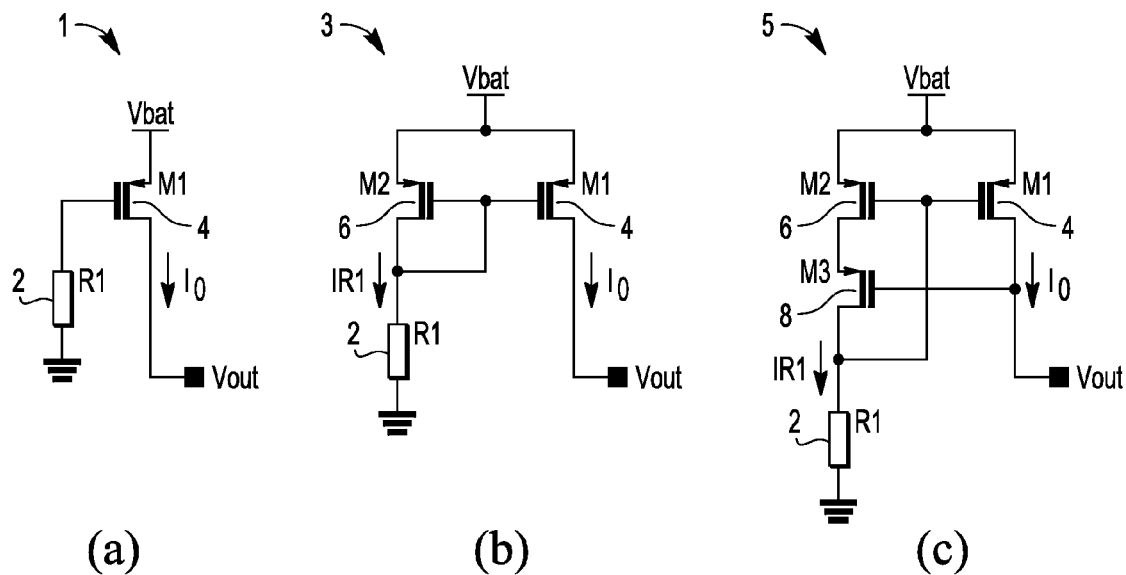
FIG. 1(a) is a simplified schematic drawing of a simple transistor switch circuit.
FIG. 1(b) is a simplified schematic drawing of a simple current mirror switch circuit.
FIG. 1(c) is a simplified schematic drawing of a modified current mirror switch circuit.
Figure 2:
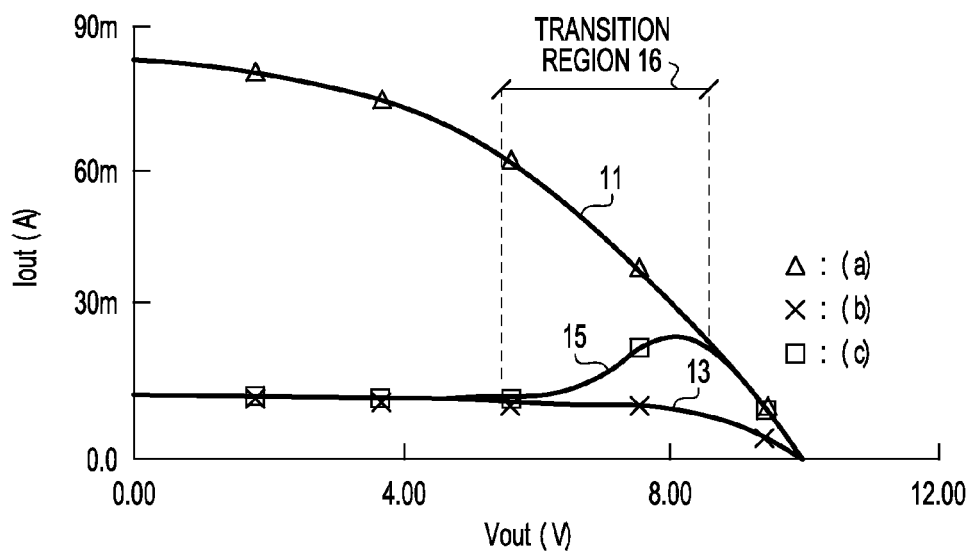
FIG. 2 depicts transfer characteristic curves for the switch circuits shown in FIGS. 1(a) through 1(c)

It will be appreciated that for simplicity and clarity of illustration, elements illustrated in the drawings have been schematically illustrated, and where considered appropriate, reference numerals have been repeated among the drawings to represent corresponding or analogous elements.

DETAILED DESCRIPTION

A method and apparatus are described for providing a high side voltage switch which limits the output peak current, protects against over voltage and under voltage (e.g., voltage outside the voltage rails), and consumes zero DC standby current. Generally speaking, a high side switch is a switch that is controlled by an external enable signal to connect or disconnect the positive side of a power source (e.g., battery or adaptor) to provide or source current to a given load. While described with reference to an example high side switch circuit, it will be appreciated that various embodiments of the present invention may be implemented with other switching circuits, including but not limited to logic gate circuits, operational amplifier circuits or other circuits whose output is driven by the input voltage. In selected embodiments, the high side switch circuit is constructed from a high side switch with auto limited current by adding a cascode transistor to the tracking or tracing branch of a current mirror circuit, where the source of the cascode transistor is used to gate the current mirror activation transistor in the reference branch. In other embodiments, the high side switch circuit is constructed by adding an additional branch to the current mirror circuit which includes an additional mirror transistor and cascode transistor connected in series between the first reference voltage (Vbat) and the output load (Vout). By sizing the cascode transistors to control the current flow through the current mirror branches, the current value of the output current through the tracing branch of a current mirror circuit is much smaller than the current through the additional branch. With reduced output current, the cascode transistor on the tracing branch may be smaller, and as a result, when the source of the cascode transistor on the tracing branch is used to gate the current mirror activation transistor in the reference branch, there is effectively a reduction of the activation voltage drop required at the current mirror activation transistor to turn "ON" the reference branch of the current mirror. As consequence, the output current in the tracing branch is kept small even if a large current is passing through the additional branch, and the peak output current is reduced since the current mirror activation transistor is turned on with less output voltage drop. In still other embodiments, the high side switch circuit is constructed to include a shut-off circuit in the additional and tracing branches which turns "OFF" the cascode transistors whenever the output voltage exceeds the first reference voltage (Vbat) by a predetermined amount.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in simplified schematic diagram form, rather than in detail, in order to avoid limiting or obscuring the present invention. Such descriptions and representations are used by those skilled in the art to describe and convey the substance of their work to others skilled in the art.

Figure 3:
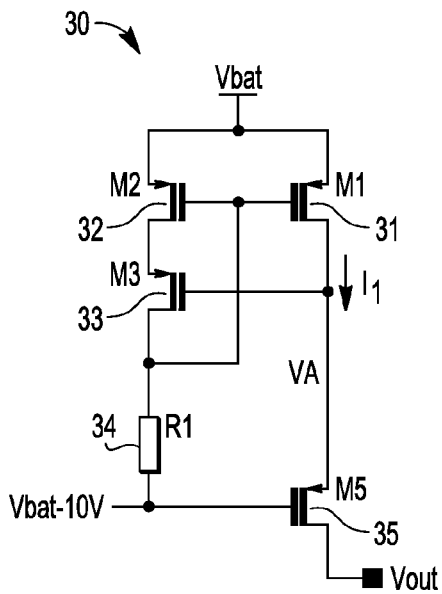
FIG. 3 illustrates in schematic form a first high side switching circuit in accordance with various selected embodiments of the present invention.
Figure 5:
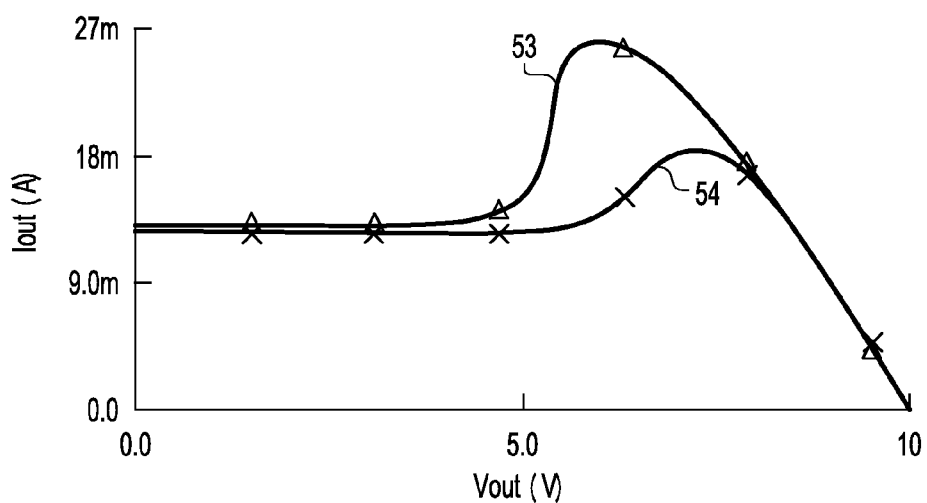
FIG. 5 depicts transfer characteristic curves for the high side switching circuits shown in FIGS. 3-4.

FIG. 3 illustrates in schematic form a first high side switching circuit 30 in accordance with various selected embodiments of the present invention. The depicted switching circuit 30 is current mirror circuit which includes a tracking branch and a reference branch. The tracking branch includes a first mirror transistor 31 (M1) that is connected in series with a first cascode transistor 35 (M5) between the first reference voltage (e.g., Vbat) and the output voltage (Vout). The reference branch includes a second mirror transistor 32 (M2), an activation transistor 33 (M3), and a resistive load 34 (R1), all of which are connected in series between the first reference voltage (e.g., Vbat) and a second reference voltage (e.g., Vbat−10V). The common gates of the first and second mirror transistors 31, 32 (M1, M2) are controlled by the voltage at the drain node of the activation transistor 33 (M3), which in turn is gated by the voltage (VA) at the drain node of the first mirror transistor 31 (M1) and source of the first cascode transistor 35 (M5). By applying the second reference voltage to gate the first cascode transistor 35 (M5) at the output of the tracing branch, the switching circuit 30 is able to operate at high voltages, and the voltage drop between the first reference voltage (e.g., Vbat) and the gate of the first cascode transistor 35 (M5) is limited to the maximum allowed gate-to-source voltage (Vgs) for the fabrication technology (e.g., 10V). In this way, the first cascode transistor 35 (M5) limits the voltage range at the node VA (the drain of the first mirror transistor 31/M1) from Vbat to Vbat−10V region. The operation of the high side switching circuit 30 is controlled by the drain-to-source voltage drop (Vds) over the first current transistor 31 (M1) to provide the controlled current performance of a simple current mirror circuit in the smaller output voltage regions, to provide the lower series on-resistance value (Rds-on) performance of a simple transistor-based switch circuit in the lower voltage drop regions, and to operate at high voltage. The device performance for the high side switching circuit 30 is depicted in FIG. 5 which depicts, at line 53, a simulated plot of the output current ($I_1$) from the high side switching circuit 30. As shown with the simulated plot line 53, the maximum or peak output current is still relatively high in the transition region (e.g., where the output voltage is between approximately 5.2 V and 8.8 V) between the "current mirror" and the "simple switch"performance regions.

Figure 4:
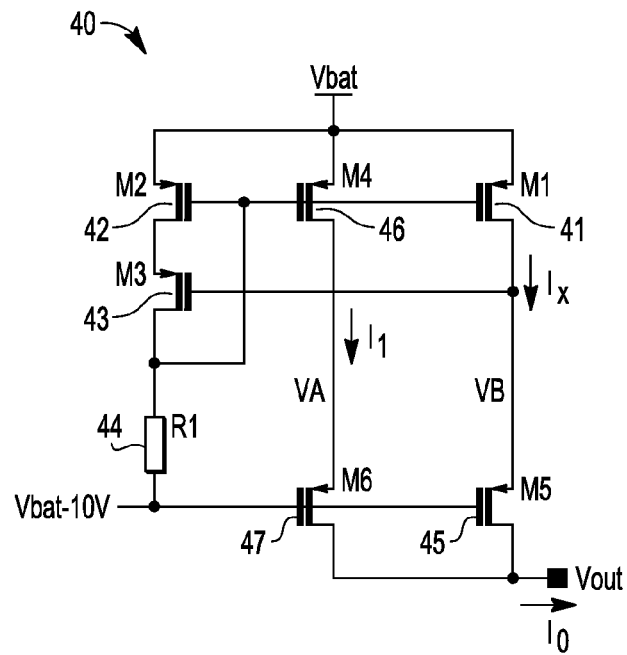
FIG. 4 illustrates in schematic form a second high side switching circuit in accordance with various selected embodiments of the present invention.

FIG. 4 illustrates in schematic form a second high side switching circuit 40 in accordance with various selected embodiments of the present invention. The depicted switching circuit 40 is current mirror circuit which includes a tracking branch, a reference branch and a third or additional branch. The tracking branch includes a first mirror transistor 41 (M1) that is connected in series with a first cascode transistor 45 (M5) between the first reference voltage (e.g., Vbat) and the output voltage (Vout). The reference branch includes a second mirror transistor 42 (M2), an activation transistor 43 (M3), and a resistive load 44 (R1), all of which are connected in series between the first reference voltage (e.g., Vbat) and a second reference voltage (e.g., Vbat−10V). The additional branch includes a third mirror transistor 46 (M4) and a second cascode transistor 47 (M6) connected in series between the first reference voltage (e.g., Vbat) and the output voltage (Vout). The common gates of the first, second and third mirror transistors 41, 42, 46 (M1, M2, M4) are controlled by the voltage at the drain node of the activation transistor 43 (M3), which in turn is gated by the voltage (VB) at the drain node of the first mirror transistor 41 (M1) and source of the first cascode transistor 45 (M5). By including the additional branch of the mirror transistor M4 and cascode transistor M6 and appropriately sizing these two transistors, it is possible to control the transition regions between mirror mode and switch mode, even for high current capability, since the tracking branch current ($I_X$) is controlled through the current mirror branches so that the tracking branch current ($I_X$) is much smaller than the additional branch current ($I_1$). Though not shown in FIG. 4, the tracking branch current ($I_X$) may be further reduced by including an additional degeneration resistor Rx in the tracking branch (e.g., between the first mirror transistor 41 and the first reference voltage (Vbat). With reduced tracking branch current, the cascode transistor 45 (M5) on the tracing branch may have much smaller physical dimensions (e.g., width and length) since only smaller currents pass through the tracking branch. As a result, there is a negligible voltage drop between source and drain of the cascode transistor 45 (M5) whenever output voltage is greater than the gate voltage of transistor 45 (M5)(Vbat−10V). Since the negligible voltage drop is used to gate the activation transistor 43 (M3) in the reference branch, there is a reduction of the activation voltage drop required at the activation transistor 43 (M3) to turn "ON" the reference branch of the current mirror. In other words, since the tracking branch current ($I_X$) is very low, the voltage VB applied to the gate of the activation transistor 43 (M3) is approximately the same as the output voltage (Vout) even when large currents pass down the additional M4/M6 branch.

By applying the second reference voltage to gate the first and second cascode transistors 45, 47 (M5, M6), the switching circuit 40 is able to operate at high voltages. In addition, the switching circuit 40 further reduces the voltage drop between the first reference voltage (e.g., Vbat) and the output voltage (Vout) that is required to turn "ON" the activation transistor 43 (M3), thereby decreasing the peak in the output current (Iout). Since the mirror and cascode transistors M1/M5 in the tracking branch are minimum size, the third branch M4/M6 size sets the on-resistance (Rds-on) of the switching circuit 40.

The operations of the switching circuits 30, 40 are illustrated with the transfer curves 53, 54 shown in FIG. 5. As depicted, line 53 is a simulated plot of the output current ($I_1$) from the high side switching circuit 30, and line 54 is a simulated plot of the output current ($I_O=I_1+I_X$, where $I_1 \gg I_X$) from the high side switching circuit 40. In the low output voltage region (e.g., where the output voltage is below approximately 3.0-5.0 V), the output currents $I_1$, $I_O$ from the switching circuits 30, 40 are quite similar. However, in the transition region (e.g., where the output voltage is between approximately 5.2 V and 8.8 V) between the "current mirror" and the "simple switch" performance regions, the simulated plot line 54 for the switching circuit 40 shows that the maximum or peak output current is significantly reduced as compared to the simulated plot line 53 for the switching circuit 30. Finally, in the high output voltage region (e.g., where the output voltage is larger than approximately 8.8 V), the output currents $I_1$, $I_O$ from the switching circuits 30, 40 are quite similar and closely track the "simple switch" output current performance. Thus, in the low output voltage region, the activation transistor 43 (M3) is turned "ON" with lower voltage drop, thereby activating the current mirror's reference branch to reduce the peak output current. And in the high output voltage region, the activation transistor 43 (M3) is turned "OFF," thereby deactivating the current mirror's reference branch while allowing a large additional branch current $I_1$ to flow through the additional branch to the output voltage load.

Figure 6:
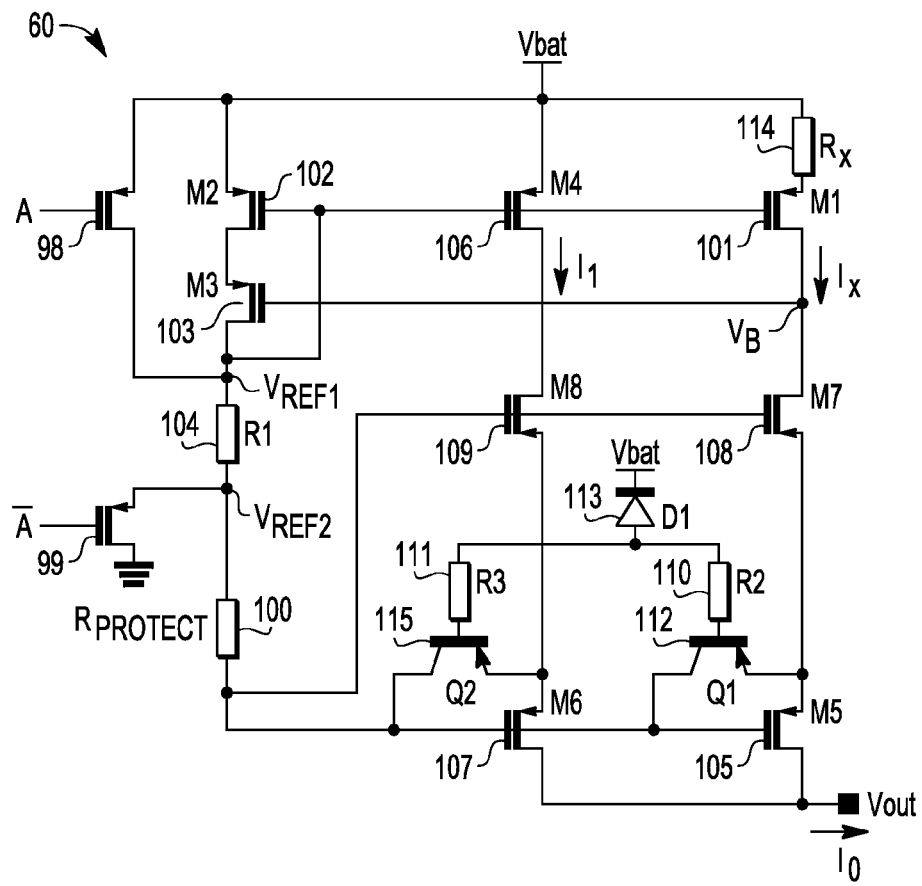
FIG. 6 illustrates in schematic form a third high side switching circuit in accordance with various selected embodiments of the present invention.

FIG. 6 illustrates in schematic form a third high side switching circuit 60 in accordance with various selected embodiments of the present invention. The depicted switching circuit 60 is current mirror circuit which includes a tracking branch, a reference branch, a third or additional branch, and a shut-off circuit in the additional and tracing branches which turns "OFF" the cascode transistors whenever the output voltage exceeds the first reference voltage (Vbat) by a predetermined amount. The tracking branch includes an (optional) degeneration resistor 114 (Rx), a first mirror transistor 101 (M1), a first cut-off transistor 108 (M7), and a first cascode transistor 105 (M5) which are connected in series between the first reference voltage (e.g., Vbat) and the output voltage (Vout). The reference branch includes a mirror reference transistor 102 (M2), an activation transistor 103 (M3), and a resistive load 104 (R1), all of which are connected in series between the first reference voltage (e.g., Vbat) and an internal clamp reference gating voltage node ($V_{REF2}$). The internal clamp reference gating voltage node ($V_{REF2}$) is pulled down by the follower transistor 99 to a voltage close to the second control signal (Abar) voltage. The second control signal (Abar) can be "LOW" (example: Vbat−10V) when the high side switching circuit 60 is "ON," or can be "HIGH" (example: Vbat) when the high side switching circuit 60 is "OFF." The follower transistor 99 prevents the internal clamp reference gating voltage node ($V_{REF2}$) from rising during an overvoltage condition on the Vout node which causes the first and second transistors 112, 115 (Q1 and Q2) to turn "ON" to generate a drop voltage across the protective resistive load 100 ($R_{PROTECT}$). The additional branch includes a third mirror transistor 106 (M4), a second cut-off transistor 109 (M8), and a second cascode transistor 107 (M6) connected in series between the first reference voltage (e.g., Vbat) and the output voltage (Vout). Again, the common gates of the first, second and third mirror transistors 101, 102, 106 (M1, M2, M4) are controlled by the internal reference gating voltage node ($V_{REF1}$) at the drain of the activation transistor 103 (M3), which in turn is gated by a control voltage ($V_B$) developed by the relatively small tracking branch current $I_X$. A high voltage level shifter provides first and second input control signals (A, Abar) which are applied to the shorting transistor 98 and to the follower transistor 99, respectively, so as to control the generation of first and second internal reference voltages ($V_{REF1}$, $V_{REF2}$) at internal gating voltage nodes on each side of the resistive load 104 (R1). Whenever the first control signal (A) is set to first reference voltage (Vbat), the second control signal (Abar) is set to a complementary voltage (Vbat−10V). For this "state," the first shorting or control transistor 98 is "OFF" and the voltage reference $V_{REF2}$ follows the second control voltage (Abar=Vbat−10V). Under these circumstances, an electrical current will pass through the resistive load 104 (R1), and with activation transistor 103 (M3) active or "ON," the switching circuit 60 is in a current mirror configuration mode so that a controlled current will flow to the output voltage (Vout). If the output voltage (Vout) increases to a voltage value close to the first voltage reference (Vbat), the activation transistor 103 (M3) will turn "OFF," and the $V_{REF1}$ and $V_{REF2}$ reference voltages will be close to the second control voltage (Abar=Vbat−10V) so that no current will flow through the resistive load 104 (R1). In this state, the switching circuit 60 changes to a simple transistor configuration with lowest series resistance and still without internal current consumption. When the first control signal is set to a complementary voltage (A=Vbat−10V), this pulls the gate voltage ($V_{REF1}$) of mirror transistors 102, 106 and 101 (M2, M4, M1) to the first voltage reference (Vbat), thereby turning "OFF" all current to output voltage (Vout). Also, when the second control voltage is set to the first reference voltage (Abar=Vbat) and no current passes by the resistive load 104 (R1), this is the high side switch "OFF" state in which there no consumption either.

To address situations where reverse current is generated through the MOS bulk diodes in the substrate when the switch output voltage exceeds the supply voltage (e.g., Vbat), a shut-off circuit is provided to shut off the reverse current. In the example embodiment shown in FIG. 6, the shut-off circuit uses the first and second cut-off transistors 108, 109 (M7, M8) in combination with shorting circuits at each of the first and second cascode transistors 105, 107 (M5, M6) to turn "OFF" the first and second cascode transistors. The shorting circuits may be implemented by coupling a first shorting transistor 112 (Q1) across the source and gate nodes of the first cascode transistor 105 (M5) and across the source and gate nodes of the first cut-off transistor 108 (M7), and also coupling a second shorting transistor 115 (Q2) across the source and gate nodes of the second cascode transistor 107 (M6) and across the source and gate nodes of the second cut-off transistor 109 (M8). As depicted, each shorting transistor may be implemented as a bipolar junction transistor (e.g., a PNP transistor) and activated with a base current, though other configurations can be used. For example, the first shorting transistor 112 (Q1) may have its collector and emitter nodes connected across the source and gate of the first cascode transistor 105 (M5) and across the source and gate of the first cut-off transistor 108 (M7), and may be further connected to be activated with a base current developed across a resistive load (e.g., 110 R2) and forward-biased diode 113 (D1) that are connected in series between the base of the first shorting transistor (e.g., 112) and the first reference voltage (e.g., Vbat). With this configuration, when the output voltage (Vout) exceeds the first reference voltage (Vbat) by a predetermined amount (e.g., by more than three forward biased diode voltage drop values), the high side switching circuit 60 controls the reverse current with residual current to saturate the first and second shorting transistors 112, 115 (Q1, Q2) to ensure that the first and second cutoff transistors 108, 109 (M7, M8) are turned "OFF" because their respective gate-to source voltages are equal to zero. At this state, the $VREF_2$ voltage will follow the output voltage and the follower control transistor 99 can be sized to be resistive or have resistance between the control transistor 99 and gates of the cutoff and cascode transistors 108, 109, 107, 105 (M8, M7, M6, M5) to ensure a low and controlled current on output node (Vout).

Figure 7:
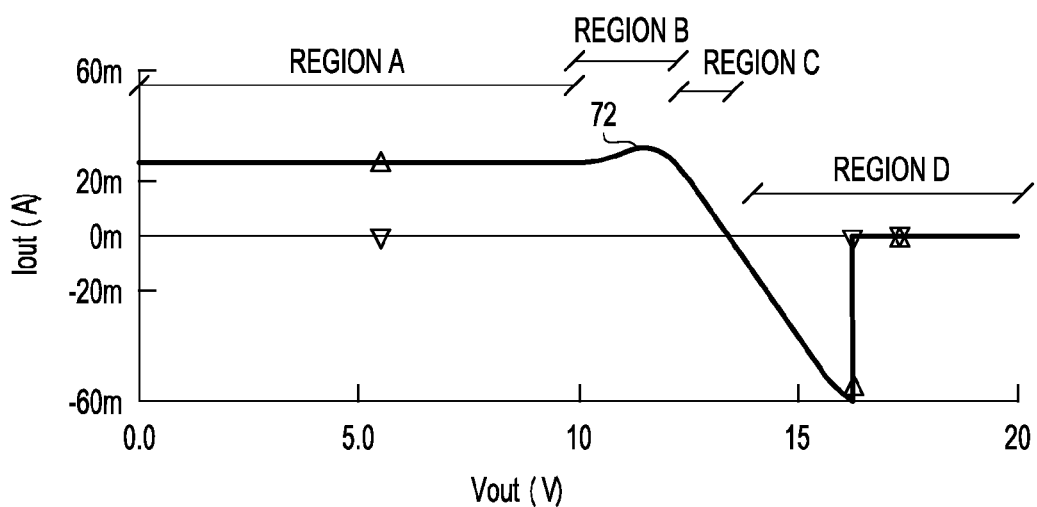
FIG. 7 depicts a simulated transfer characteristic curve for the high side switching circuit shown in FIG. 6.

The operation of the switching circuit 60 is illustrated in FIG. 7 which depicts a simulated transfer characteristic curve 72 for the high side switching circuit 60 shown in FIG. 6. In this simulation, the switching circuit 60 was designed to provide an external current limitation of 35 mA by applying a first reference voltage (Vbat) of 13.5 V and keeping the output drop voltage value as low as possible. Region A of the curve 72 illustrates that the high side switching circuit 60 has limited output current in the low output voltage region (e.g., where the output voltage is below approximately 10 V), resulting from the activation transistor 103 (M3) turning "ON" the current mirror's reference branch. Region B of the curve 72 is the transition region (e.g., where the output voltage is between approximately 10 V and 12 V) where the peak output current is controlled to be significantly reduced as compared to the other switching circuits, resulting from the tracking branch current $I_X$ being controlled through the current mirror branches to turn "ON" the activation transistor 103 (M3) with output voltages (Vout) more close to the first reference voltage (Vbat) to activate the current mirror circuitry. And when the output voltage (Vout) is close to first reference voltage (Vbat), the high side switch is in Region C, which is the region where the activation transistor 103 (M3) is turned "OFF," thereby deactivating the current mirror's reference branch while providing a high current capability by allowing the large additional branch current $I_1$ and smaller tracking branch current $I_X$ to flow as the output current $I_O$ to the output voltage load. Region C of the curve 72 has no internal current consumption, just the output current flowing by output node (Vout). Finally, Region D of the curve 72 illustrates that the high side switching circuit 60 is protected against voltage above Vbat at Vout, resulting from the first and second cut-off transistors 108, 109 (M7, M8) being turned "OFF" by the shorting circuits (Q1, Q2).

By now it should be appreciated that there has been provided a current mirror type high voltage switching circuit which includes first, second, and third current branches. The first current branch is connected between a first reference voltage and an output voltage load, and generates a first control current. The second current branch is connected between the first reference voltage and the output voltage load, and generates a load current that is larger than the first control current. The third current branch is connected between the first reference voltage and a second reference voltage, and generates a reference voltage in response to a control voltage developed by the first control current, where the reference voltage controls the first, second and third current branches so that the load current increases as the output voltage across the output voltage load decreases to a first threshold voltage, decreases as the output voltage decreases to a second lower threshold voltage, and then stabilizes as the output voltage decreases below the second lower threshold voltage. In selected embodiments, the first current branch may be implemented as a degeneration resistor, a first mirror transistor, and a first cascode transistor that are connected between the first reference voltage and the output voltage load. In addition, the second current branch may be implemented as a second mirror transistor and second cascode transistor connected between the first reference voltage and the output voltage load, where the control terminals (e.g., gates) of the first and second mirror transistors are connected to the reference voltage, and where sources of the first and second mirror transistors are coupled to the first reference voltage. Finally, the third current branch may be implemented as a third mirror transistor and an activation transistor connected between the first reference voltage and the reference voltage, where the control terminals of the first, second and third mirror transistors are connected to the reference voltage, where sources of the first, second and third mirror transistors are coupled to the first reference voltage, and where a control terminal of the activation transistor is connected to a drain of the first mirror transistor. The current mirror type high voltage switching circuit may also a shut-off circuit connected between the mirror and cascode transistors in the first and second current branches which disconnects the cascode transistor from the mirror transistor whenever an output voltage developed across the output voltage load exceeds the first reference voltage by a predetermined amount. In an example, embodiment, the shut-off circuit may be implemented with a first cut-off transistor connected between the first mirror transistor and the first cascode transistor, where the first cut-off transistor has a gate and source that are connected across first and second current terminals (e.g., emitter and collector) of a first shorting transistor which is saturated when the output voltage load exceeds the first reference voltage by a predetermined amount.

In another form, there has been provided a current mirror type high voltage switching circuit. As disclosed, the switching circuit includes first and second mirror transistors having gates connected to each other and sources coupled to a first reference voltage. The switching circuit also includes an activation transistor having a drain connected to the gates of the first and second mirror transistors and across a first resistive load to a second reference voltage, a source connected to a drain of the second mirror transistor, and a gate connected to a drain of the first mirror transistor. In addition, a first cascode transistor is included having a source coupled to the drain of the first mirror transistor, a drain connected to an output voltage load, and a gate connected to the second reference voltage, such that a control current at the source of the first mirror transistor develops a control voltage at the gate of the activation transistor to activate the activation transistor, thereby turning ON the second mirror transistor when the output voltage decreases to a first threshold voltage. In selected embodiments, a degeneration resistor may be connected between the first reference voltage and the source of the first mirror transistor to further reduce the size of the control current. The switching circuit may also include a third mirror transistor and second cascode transistor, where the gate of the third mirror is connected the gates of the first and second mirror transistors, the source of the third mirror transistor is connected to the first reference voltage, the source of the second cascode transistor is coupled to the drain of the third mirror transistor, the drain of the second cascode transistor is connected to the output voltage load, and the gate of the second cascode transistor is connected to the second reference voltage, such that a high current may pass through the third mirror transistor and second cascode transistor that is larger than the control current at the source of the first mirror transistor. The switching circuit may also include a first shut-off circuit which disconnects the first cascode transistor from the first mirror transistor whenever an output voltage developed across the output voltage load exceeds the first reference voltage by a predetermined amount. In addition, a second shut-off circuit may be connected which disconnects the second cascode transistor from the third mirror transistor whenever an output voltage developed across the output voltage load exceeds the first reference voltage by a predetermined amount. Finally, a first shorting transistor may be provided that is source-drain connected across the second mirror transistor and activation transistor and that has a gate connected to receive a first input control signal so that the source of the activation transistor is shorted to the first reference voltage across the first shorting transistor in response to the first input control signal. In addition, a follower transistor may be provided having a drain connected to the second reference voltage, a source connected to gate of the first cascode transistor, and a gate connected to receive a second input control signal that is inverted (or complementary) with respect to the first input control signal.

In yet another form, there is provided methodology for implementing a switched circuit. In the disclosed methodology, a controlled current is provided to an output load from a power supply voltage through a first current path (which includes at least a first transistor and first cascode transistor) when an output voltage developed at the output load is in a high output voltage region, where the first cascode transistor is coupled between the first transistor and the output load and is gated by a second reference voltage which is offset from the power supply by a predetermined offset voltage to provide a maximum voltage drop between the power supply and the gate of the first cascode transistor. In addition, a peak output current is provided to the output load from the power supply voltage through the first current path and a second current path (which includes a second transistor and second cascode transistor) when the output voltage developed at the output load is in a transition output voltage region, where the second cascode transistor is coupled between the second transistor and the output load and is gated by the second reference voltage to provide a maximum voltage drop between the power supply and the gate of the second cascode transistor. A limited current is also provided to the output load from the power supply through the first current path and second current path when the output voltage developed at the output load is in a low output voltage region. In the disclosed methodology, a drain-to-source voltage drop over the first transistor controls the first transistor to provide a relatively low on-resistance when the output voltage developed at the output load is in the high output voltage region, and also controls the first and second transistors to provide the controlled current when the output voltage developed at the output load is in the low output voltage region. In addition, the first and second transistors may be disconnected from the first and second cascode transistors whenever the output voltage developed at the output load exceeds the power supply voltage by a predetermined amount. For example, this may be done by saturating first and second PNP bipolar junction transistors which are, respectively, connected across the source and gate terminals of the first and second cascode transistors whenever the output voltage developed at the output load exceeds the power supply voltage by a predetermined amount.

Although the described exemplary embodiments disclosed herein are directed to various examples of high side switching circuits and methods for using same, the present invention is not necessarily limited to the example embodiments which illustrate inventive aspects of the present invention that are applicable to a wide variety of switching circuits and processes. For example, various embodiments of the switching circuit may be used to form low side switching circuits. In addition, the switching circuit can advantageously be implemented in integrated circuit devices that can be used in automotive, consumer and industrial applications. In selected embodiments, the switching circuit monitors the main transistor's "turn on" voltage drop and compares it with a voltage drop of a smaller-sized, matched transistor that is supplied with a controlled current. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. In addition and unless otherwise indicated from the context, the terms "connect" or "connected" refer to a direct electrical connection (i.e., without any intervening electrical component(s) or element(s)), while the terms "coupled" or "coupling" refer to direct electrical connection or an indirect electrical connection, such as being electrically connected through another intervening electrical component(s) or element(s).

What is claimed is:

1. A current mirror type high voltage switching circuit, comprising:
    a first current branch connected between a first reference voltage and an output voltage load for generating a first control current;
    a second current branch connected between the first reference voltage and the output voltage load for generating a load current that is larger than the first control current; and
    a third current branch connected between the first reference voltage and a second reference voltage for generating a third reference voltage in response to a control voltage developed by the first control current, where the third reference voltage controls the first, second and third current branches so that the load current increases as the output voltage across the output voltage load decreases to a first threshold voltage, decreases as the output voltage decreases to a second lower threshold voltage, and then stabilizes as the output voltage decreases below the second lower threshold voltage.

2. The current mirror type high voltage switching circuit of claim 1, where the first current branch comprises a degeneration resistor, a first mirror transistor, and a first cascode transistor connected between the first reference voltage and the output voltage load.

3. The current mirror type high voltage switching circuit of claim 1, where the first current branch comprises a first mirror transistor and first cascode transistor connected between the first reference voltage and the output voltage load.

4. The current mirror type high voltage switching circuit of claim 3, where the second current branch comprises a second mirror transistor and second cascode transistor connected between the first reference voltage and the output voltage load, where control terminals of the first and second mirror transistors are connected to the third reference voltage, and where sources of the first and second mirror transistors are coupled to the first reference voltage.

5. The current mirror type high voltage switching circuit of claim 4, where the third current branch comprises a third mirror transistor and an activation transistor connected between the first reference voltage and the third reference voltage, where control terminals of the first, second and third mirror transistors are connected to the third reference voltage, where sources of the first, second and third mirror transistors are coupled to the first reference voltage, and where a control terminal of the activation transistor is connected to a drain of the first mirror transistor.

6. The current mirror type high voltage switching circuit of claim 4, further comprising:
    a first shut-off circuit which disconnects the first cascode transistor from the first mirror transistor whenever an output voltage developed across the output voltage load exceeds the first reference voltage by a predetermined amount; and
    a second shut-off circuit which disconnects the second cascode transistor from the second mirror transistor whenever an output voltage developed across the output voltage load exceeds the first reference voltage by a predetermined amount.

7. The current mirror type high voltage switching circuit of claim 6, where the first shut-off circuit comprises a first cut-off transistor connected between the first mirror transistor and the first cascode transistor, where the first cut-off transistor has a gate and source that are connected across first and second current terminals of a first shorting transistor which is saturated when the output voltage load exceeds the first reference voltage by a predetermined amount.

8. The current mirror type high voltage switching circuit of claim 7, where the second shut-off circuit comprises a second cut-off transistor connected between the second mirror transistor and the second cascode transistor, where the second cut-off transistor has a gate and source that are connected across first and second current terminals of a second shorting transistor which is saturated when the output voltage load exceeds the first reference voltage by a predetermined amount.

9. The current mirror type high voltage switching circuit of claim 7, where the first shorting transistor comprises a PNP bipolar junction transistor.

10. A current mirror type high voltage switching circuit comprising:
    first and second mirror transistors having gates connected to each other and sources coupled to a first reference voltage;
    an activation transistor having a drain connected to the gates of the first and second mirror transistors and across a first resistive load to a second reference voltage, a source connected to a drain of the second mirror transistor, and a gate connected to a drain of the first mirror transistor; and
    a first cascode transistor having a source coupled to the drain of the first mirror transistor, a drain connected to an output voltage load, and a gate coupled to the second reference voltage, such that a control current at the drain of the first mirror transistor develops a control voltage at the gate of the activation transistor to activate the activation transistor, thereby turning ON the second mirror transistor when the output voltage decreases to a first threshold voltage.

11. The current mirror type high voltage switching circuit of claim 10, further comprising a degeneration resistor connected between the first reference voltage and the source of the first mirror transistor.

12. The current mirror type high voltage switching circuit of claim 10, further comprising:

a third mirror transistor having a gate connected the gates of the first and second mirror transistors and a source connected to the first reference voltage; and a second cascode transistor having a source coupled to the drain of the third mirror transistor, a drain connected to the output voltage load, and a gate coupled to the second reference voltage, such that a high current may pass trough the third mirror transistor and second cascode transistor that is larger than the control current at the drain of the first mirror transistor.

13. The current mirror type high voltage switching circuit of claim 12, further comprising:
    a first shut-off circuit which disconnects the first cascode transistor from the first mirror transistor whenever an output voltage developed across the output voltage load exceeds the first reference voltage by a predetermined amount; and
    a second shut-off circuit which disconnects the second cascode transistor from the third mirror transistor whenever an output voltage developed across the output voltage load exceeds the first reference voltage by a predetermined amount.

14. The current mirror type high voltage switching circuit of claim 13, where the first shut-off circuit comprises a first cut-off transistor connected between the first mirror transistor and the first cascode transistor, where the first cut-off transistor has a gate and source that are connected across collector and emitter terminals of a first PNP bipolar junction transistor which is saturated when the output voltage load exceeds the first reference voltage by a predetermined amount.

15. The current mirror type high voltage switching circuit of claim 13, where the second shut-off circuit comprises a second cut-off transistor connected between the second mirror transistor and the second cascode transistor, where the second cut-off transistor has a gate and source that are connected across collector and emitter terminals of a second PNP bipolar junction transistor which is saturated when the output voltage load exceeds the first reference voltage by a predetermined amount.

16. The current mirror type high voltage switching circuit of claim 10, further comprising:
    a first shorting transistor that is source-drain connected across the second mirror transistor and activation transistor and that has a gate connected to receive a first input control signal so that the drain of the activation transistor is shorted to the first reference voltage across the first shorting transistor in response to the first input control signal; and
    a second follower transistor having a drain connected to the second reference voltage, a source coupled to the gate of the first cascode transistor, and a gate connected to receive a second input control signal that is inverted with respect to the first input control signal.

17. A method of implementing a switched circuit, comprising:
    providing a controlled current to an output load from a power supply through a first current path comprising a first transistor and first cascode transistor when an output voltage developed at the output load is in a high output voltage region, where the first cascode transistor is coupled between the first transistor and the output load and is gated by a second reference voltage which is offset from the power supply by a predetermined offset voltage to provide a maximum voltage drop between the power supply and the gate of the first cascode transistor;
    providing a peak output current to the output load from the power supply through the first current path and a second current path comprising a second transistor and second cascode transistor when the output voltage developed at the output load is in a transition output voltage region, where the second cascode transistor is coupled between the second transistor and the output load and is gated by the second reference voltage to provide a maximum voltage drop between the power supply and the gate of the second cascode transistor; and
    providing a limited current to the output load from the power supply through the first current path and second current path when the output voltage developed at the output load is in a low output voltage region.

18. The method of claim 17, where a drain-to-source voltage drop over the first transistor controls the first transistor to provide a relatively low on-resistance when the output voltage developed at the output load is in the high output voltage region, and where the drain-to-source voltage drop over the first transistor controls the first and second transistors to provide the controlled current when the output voltage developed at the output load is in the low output voltage region.

19. The method of claim 17, further comprising disconnecting the first and second transistors from the first and second cascode transistors whenever the output voltage developed at the output load exceeds the power supply voltage by a predetermined amount.

20. The method of claim 19, further comprising saturating first and second PNP bipolar junction transistors which are, respectively, connected across the source and gate terminals of the first and second cascode transistors whenever the output voltage developed at the output load exceeds the power supply voltage by a predetermined amount.

\* \* \* \* \*